(12) United States Patent
Lee et al.

(10) Patent No.: US 8,524,584 B2
(45) Date of Patent: Sep. 3, 2013

(54) CARBON IMPLANTATION PROCESS AND CARBON ION PRECURSOR COMPOSITION

(75) Inventors: William D. Lee, Newburyport, MA (US); Daniel R. Tieger, Manchester, MA (US); Tseh-Jen Hsieh, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 13/010,397

(22) Filed: Jan. 20, 2011

(65) Prior Publication Data

US 2012/0190181 A1    Jul. 26, 2012

(51) Int. Cl.
*H01L 21/26* (2006.01)

(52) U.S. Cl.
USPC ........ 438/513; 438/514; 438/515; 250/491.1; 250/492.1; 250/492.21

(58) Field of Classification Search
USPC .............. 250/491.1, 492.1, 492.21; 427/527, 427/530; 257/E21.057, E21.058, E21.059, 257/E21.12, E21.147, E21.248; 438/513–515, 438/542, 548; 117/2, 95; 216/62
See application file for complete search history.

(56) References Cited

U.S. PATENT DOCUMENTS

| | | | |
|---|---|---|---|
| 5,360,986 A | 11/1994 | Candelaria | |
| 5,441,901 A | 8/1995 | Candelaria | |
| 6,251,802 B1 | 6/2001 | Moore et al. | |
| 7,446,326 B2 * | 11/2008 | Chaney et al. | 250/492.21 |
| 8,080,071 B1 * | 12/2011 | Vail | 51/293 |
| 2004/0060387 A1 * | 4/2004 | Tanner-Jones | 75/10.2 |
| 2009/0200460 A1 | 8/2009 | Chaney et al. | |
| 2010/0323113 A1 * | 12/2010 | Ramappa et al. | 427/398.1 |

* cited by examiner

*Primary Examiner* — Hsien Ming Lee
(74) *Attorney, Agent, or Firm* — Cantor Colburn LLP

(57) ABSTRACT

Methods and carbon ion precursor compositions for implanting carbon ions generally includes vaporizing and ionizing a gas mixture including carbon oxide and methane gases in an ion source to create a plasma and produce carbon ions. The ionized carbon within the plasma is then extracted to form an ion beam. The ion beam is mass analyzed with a mass analyzer magnet to permit the ionized carbon to pass therethrough and implant into a workpiece.

14 Claims, 3 Drawing Sheets

CARBON IMPLANTATION PROCESS AND CARBON ION PRECURSOR COMPOSITION

BACKGROUND

The present disclosure generally relates to semiconductor ion implantation, and more specifically, to methods for selectively implanting ionized carbon species into semiconductor work pieces.

Ion implanters can be used to treat silicon wafers by bombardment of the wafers with an ion beam. One use of such beam treatment is to selectively implant the wafers with impurities and/or dopants of a controlled concentration for fabrication of integrated circuits.

A typical ion implanter includes an ion source, an ion extraction device, a mass analysis device, a beam transport device and a wafer processing device. The ion source generates ions of desired atomic or molecular species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, the semiconductor wafers are implanted with the atomic or molecular species or ionic fragments thereof in the wafer processing device.

Ion energy is used to control junction depth in semiconductor devices. The energy of the ions that make up the ion beam determines the degree of depth of the implanted ions. High energy processes such as those used to form retrograde wells in semiconductor devices require implants of up to a few million electron-volts (MeV), while shallow junctions may only demand energies below 1 thousand electron-volts (keV), and ultra-shallow junctions may require energies as low as 250 electron-volts (eV). Typically, high current implanters (generally greater than 10 milliamps (mA) ion beam current) are used for high dose implants, while medium current implanters (generally capable up to about 1 mA beam current) are used for lower dose applications.

During semiconductor manufacturing it is sometimes beneficial to perform carbon implants. Specifically, it may be desirable to have carbon implants that yield a large amount of damage to the crystalline structure of the silicon substrate, for example, in which the integrated circuit is built. In some applications, it is beneficial to implant ionic carbon species to pre-amorphize selected portions of the silicon substrate. The ionized carbon implantation can be controlled so that only a certain depth of the silicon substrate is amorphized. The remaining depth remains crystalline. A dopant source such as phosphorus, arsenic, boron, or indium can then be implanted into a region of the amorphous portion and subsequently annealed to actively diffuse the dopant ions and recrystallize the amorphous portion. In this manner, the carbon species can provide pre-amorphization implantation and serves as a barrier to dopant diffusion for advanced source drain extension formation.

In other applications, it is sometimes beneficial to implant carbon to form p-type drain extensions so as to reduce transient enhanced diffusion of the p-dopant ion, e.g., boron. In addition, carbon ion implantation is sometimes beneficial during formation of shallow junctions so as to provide control over recrystallization of the amorphous regions during a subsequent annealing step. Carbon is also being investigated in conjunction with providing strain in NMOS implantation.

Presently, the most common precursor for carbon implants is carbon dioxide ($CO_2$). One of the problems associated with the use of $CO_2$ is the reduced operating lifetime of the ion source. During generation of the carbon ions from $CO_2$ with the ion source, 2 oxygen atoms are also generated. These oxygen atoms are highly reactive (second in reactivity only to fluorine) and can deleteriously corrode, i.e., oxidize, the ion source, which is typically a metal electrode, thereby decreasing the operating lifetime.

Phosphine gases have been known to be added to carbon dioxide as a co-gas so as to react with the free oxygen generated by ionization of carbon dioxide rendering it less destructive to the ion source. However, as a co-gas, phosphine adds gas flow and pressure to the ion source without adding any usable precursor material. Moreover, phosphine is relative toxic and expensive It would be desirable to minimize oxidation of the ion sources when utilized with carbon dioxide for generation of carbon ions in ion implantation apparatuses.

BRIEF SUMMARY

Disclosed herein are processes for implanting carbon ions into a workpiece or the selected ionized mass of the lower mass byproducts into a workpiece. In one embodiment, the process for implanting carbon ions into a workpiece comprises supplying a mixture of a carbon oxide gas and a methane gas to an ion source; ionizing the carbon oxide gas and the methane gas with the ion source to create a plasma and produce ionized carbon species and water; extracting the ionized carbon species within the plasma to form an ion beam; and exposing the workpiece to the ion beam to implant the ionized carbon into a workpiece.

A carbon ion precursor composition for an ion implantation apparatus comprises a carbon oxide gas; and a methane gas.

In another embodiment, a process of implanting carbon ions into a workpiece comprises utilizing an ion implantation apparatus comprising an ion source adapted to ionize a process gas into an ion beam, and a mass analyzer adapted to pass though only selected species of said ion beam; supplying a mixture comprising a carbon oxide gas and a methane gas to the ion source; ionizing the mixture to produce carbon ions; using the mass analyzer to remove unwanted species from the ion beam; and implanting the carbon ions into the workpiece.

These and other objects, advantages and features of the disclosure will become better understood from the detailed description of the disclosure that is described in conjunction with the accompanying drawings.

DETAILED DESCRIPTION

The present disclosure generally relates to carbon ion precursor compositions for generating the ionized carbon species and to methods of implanting ionized carbon into a workpiece. Advantageously, the carbon ion precursor compositions for generating the carbon ions include a combination of a carbon oxide and methane ($CH_4$) gases. Unlike the prior art's use of phosphine as a co-gas, the presence of methane gas advantageously increases the number of carbon atoms that are generated by the ion source while concomitantly decreasing the amount of reactive oxygen atoms that can adversely reduce the operating lifetimes of the ion sources. Suitable carbon oxides include, without limitation, carbon monoxide, carbon dioxide, carbon suboxide, and the like, and mixtures thereof. By way of example, reference below will be made with respect to the most common precursor for carbon implants, i.e., carbon dioxide.

As shown in the idealized stoichiometry below, an exemplary carbon ion precursor composition that includes stoichiometric amounts of methane and carbon dioxide gases forms 2 carbon ions and 2 water molecules during generation of the plasma.

$$CO_2 + CH_4 \rightarrow 2C^+ + 2H_2O$$

The water that is generated can then be evacuated from the arc chamber by a vacuum system, which is a common component of ion implantation systems. The carbon ions that are generated can be selectively extracted and accelerated at high velocities suitable for implantation into a workpiece of interest. Although this idealized reaction oversimplifies the complexity of the chemical dynamics in the arc chamber within which the ion source is typically disposed, the adverse effects of oxygen on the ion source are minimized by the generation of water, which is substantially harmless to the ion source and can be readily removed from the chamber by vacuum. In contrast, exposing the carbon dioxide gas by itself (i.e., without methane) to the ion source produces less of the desired carbon ions but can also produce oxygen species, which can quickly corrode the ion source.

Although generation of carbon ions by the ion source is a fairly complex process, there is no minimal amount of methane in the carbon ion precursor composition since it is believed that any amount will react with the oxygen species to form water, thereby advantageously lowering the amount of oxygen species present within the arc chamber. As to a maximum amount, in one embodiment, a molar excess of methane to carbon dioxide is 70% or less can be desired for some applications. In another embodiment, the molar excess of methane to carbon dioxide is less than 50 percent, and in still other embodiments, the molar excess is less than 30 percent.

Figure 1:
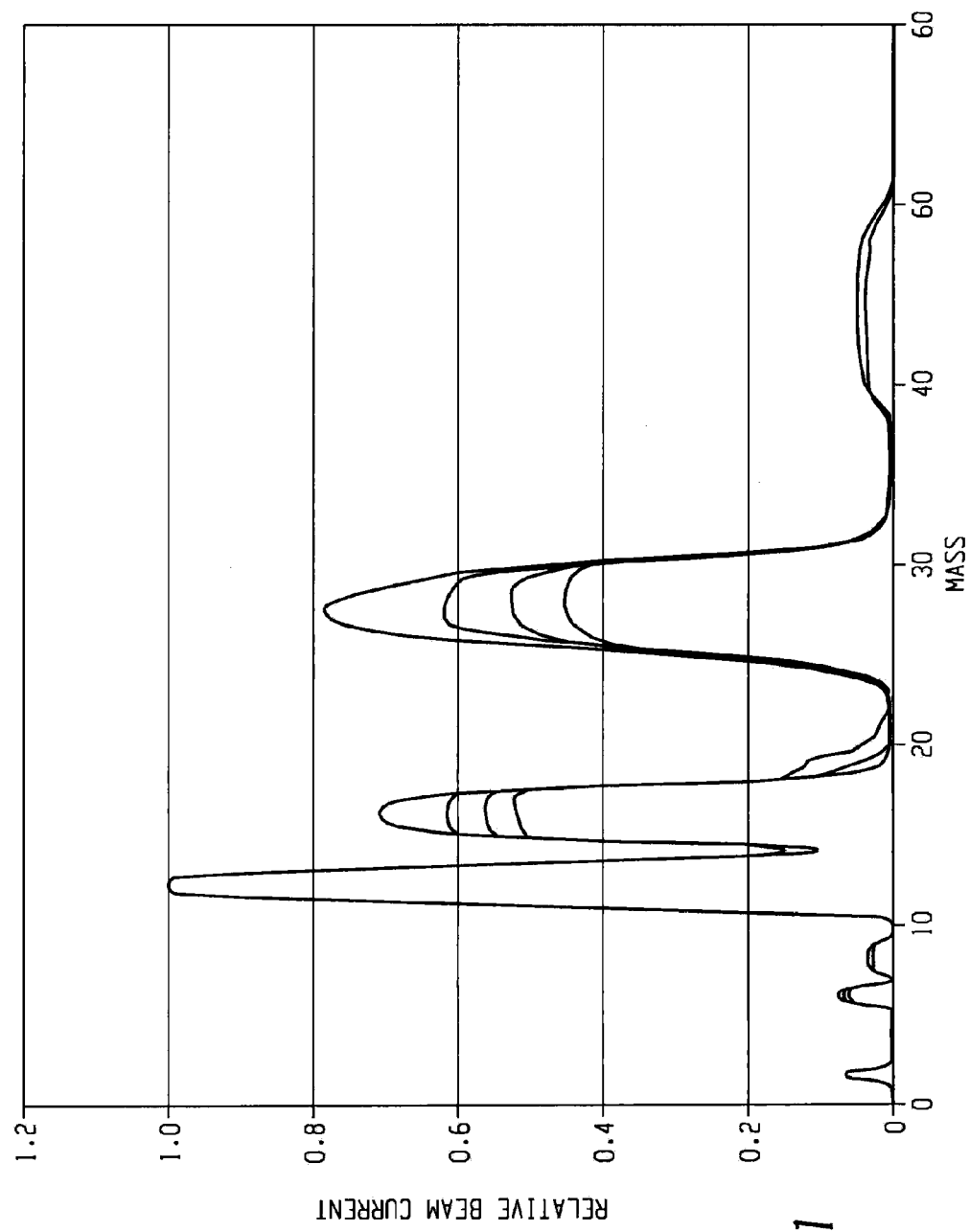
FIG. 1 graphically illustrates mass peak as a function of relative beam current.

FIG. 1 graphically illustrates mass spectra as a function of relative beam current from a run with $CO_2$ at various ratios with $CH_4$. The carbon dioxide was flowed into the arc chamber of an ion implantation apparatus at a flow rate of 3 standard cubic centimeters per minute (sccm) with no methane co-gas or with varying amounts of methane gas, e.g., flow rates of 1, 2, and 3 sccm. The cogas can be inserted as a separate gas from a different string or can be premixed in the same bottle beforehand, once a desired ratio has been determined. The operating pressures in the ion source are in the low to mid E-5 Ton range. High current ion source life varies with species usage but can be several hundred hours. Table 1 below shows the gas flow rates for the different gas compositions and the corresponding approximate mass peak values resulting from each particular ratio of gases. In each instance, the mass peak corresponding to carbon (m/z=12) has been normalized to illustrate the relative ratio of the other chemical species generated by the ion source.

TABLE 1

| FLOW RATE OF $CH_4$ (sccm) | C | O | CO |
|---|---|---|---|
| 0 ($CO_2$ only) | 1 | 0.68 | 0.79 |
| 1 | 1 | 0.61 | 0.61 |
| 2 | 1 | 0.57 | 0.57 |
| 3 | 1 | 0.51 | 0.50 |

As shown in the Table as well as in FIG. 1, the introduction of methane as a co-gas reduced the amounts of oxygen and carbon monoxide produced by the ion source as evidenced by the reduction in the mass peaks corresponding to oxygen (m/z=16) and carbon monoxide (m/z=28). Moreover, a shoulder corresponding to water (m/z=18) was observed as a function of increasing amounts of methane as well as a gradual shift to the right of the mass peak corresponding to carbon monoxide (m/z=28). As previously discussed, the water vapor can be readily removed from the arc chamber by vacuum.

Figure 2:
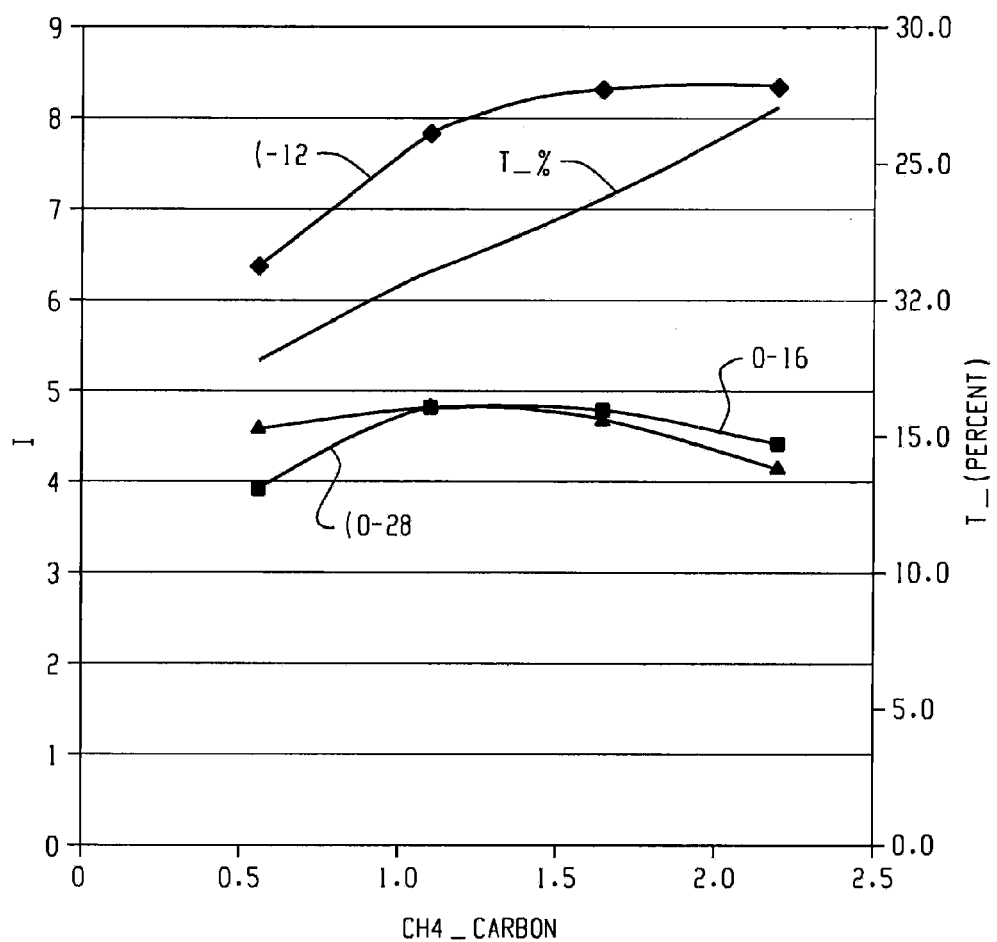
FIG. 2 graphically illustrates beam currents as a function of various carbon dioxide/methane ratios.

In FIG. 2, actual beam currents from the various gas ratios are illustrated for the different mass peaks of C, CO, and O. Also shown is the percent transmission for the carbon beam current (defined as the beam current divided by the difference of extraction minus suppression current) as a function of the amount of carbon in the gas mixture by mass. No methane co-gas is at about 0.57 sccm of carbon; the 3:1 ratio of $CO_2$ to $CH_4$ is at about 1.11 sccm; the 3:2 ratio of $CO_2$ to $CH_4$ is at about 1.67 sccm; and the 3:3 ratio of $CO_2$ to $CH_4$ is at about 2.24 sccm. While the transmission continues to climb as a function of increased methane, the carbon beam current saturates and so the optimal ratio of $CO_2$ to $CH_4$ in this particular example appears to be at a 3:2 mass flow control setting, which yields 1.65 sccm carbon by mass and a corrected ratio of 1.46 $CO_2$ to $CH_4$.

Figure 3:
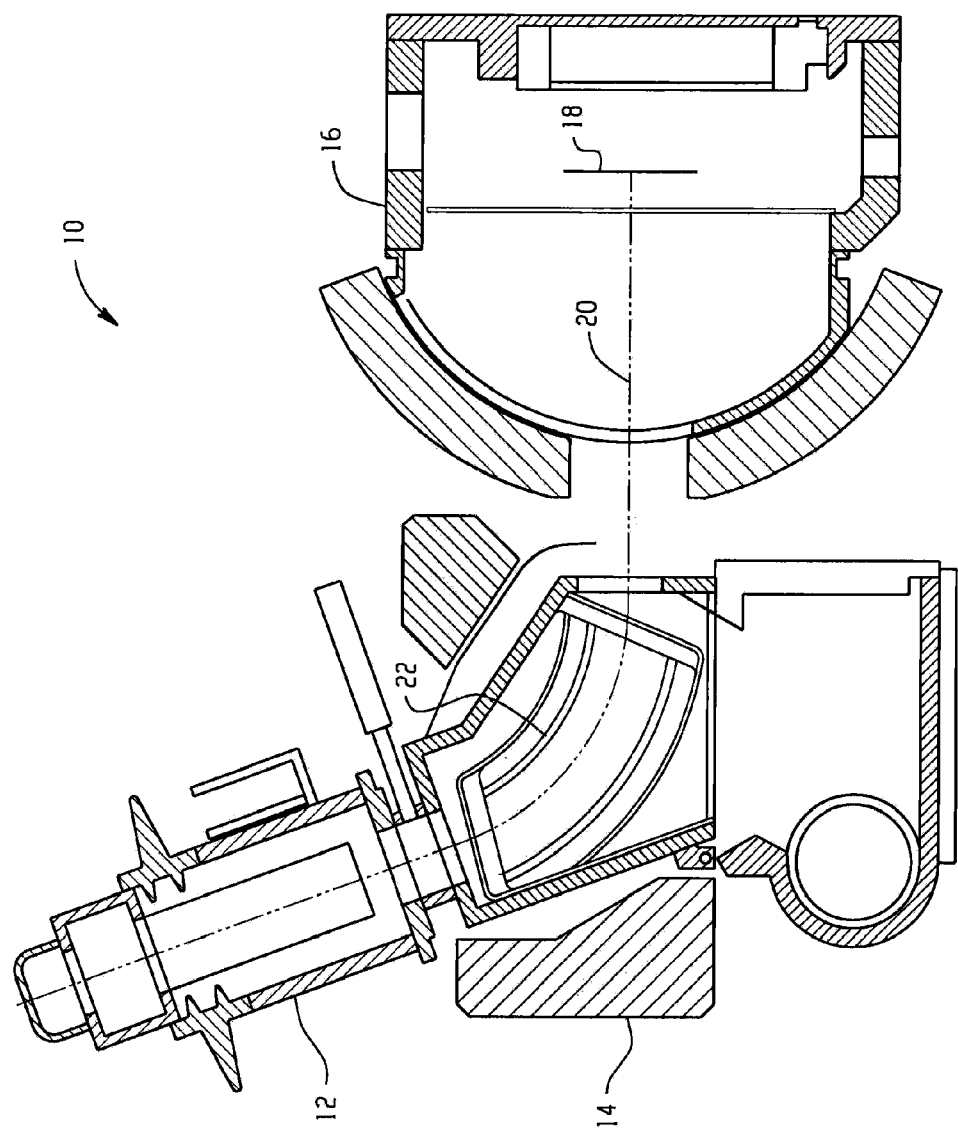
FIG. 3 schematically illustrates an exemplary ion implantation apparatus.

FIG. 3 schematically illustrates an exemplary ion implantation device 10. The device generally includes an ion source 12, a beamline assembly 14, and a targeting chamber 16 housing a workpiece 18. The ion source 12 generates charged ions from the gas mixture of carbon dioxide and methane gases that are subsequently extracted during operation to form an ion beam 20. Ions are created by applying a voltage across electrodes of the ion source, which is generally known as an arc voltage. The beamline assembly 14 typically includes a mass analyzer 22 formed at about a ninety degree angle and includes one or more magnets that serve to establish a (dipole) magnetic field therein. As the ion beam 20 enters the mass analyzer 22, it is correspondingly bent by the magnetic field such that undesired ions are deflected and the desired ions pass therethrough. Once through the mass analyzer 22, the ion beam may be accelerated, decelerated, focused or otherwise modified for implantation into the workpiece. In this manner, the ions that pass therethrough have a desired charge to mass ratio, which are subsequently implanted into the workpiece. The ion implantation apparatus will include other components known by those skilled in the art.

During implantation of the carbon ions having the desired charge to mass ratio, the workpiece can be mechanically scanned in two dimensions perpendicular to the ion beam. The entire path traversed by the ion beam 20 is under vacuum during implantation. The ion source for generating the ion beam can be a single plasma ion source or a dual plasma ion source. Likewise, the ion sources can be an indirectly heated cathode ion source or one that generates ions by exposure to radiofrequency (RF) energy. The carbon ion precursor composition can be fed using a mass flow controller (not shown), which controls the flow of gas, and thus meters the amount of carbon dioxide and methane gases that are provided to the ion source 12. Carbon implants are generally in the 1-30 keV energy range and the doses vary from low to mid E13s to mid E15s depending on the application.

The foregoing descriptions of the preferred embodiments of the disclosure have been presented for purposes of illustration and description. It is not intended to be exhaustive or to limit the disclosure to the precise forms disclosed. Obvious modifications or variations are possible in light of the above teachings. The embodiments were chosen and described to provide the best illustration of the principles of the disclosure and its practical applications to thereby enable one of ordinary skill in the art to utilize the disclosure in various embodiments and with various modifications as are suited to the particular use contemplated. All such modifications and variations are within the scope of the disclosure as determined by the appended claims when interpreted in accordance with the breadth to which they are fairly, legally and equitably entitled.

What is claimed:

1. A process for implanting carbon ions into a workpiece, the process comprising:
   supplying a mixture of a carbon oxide gas and a methane gas to an ion source;
   ionizing the carbon oxide gas and the methane gas with the ion source at a stoichiometry effective to create a feedstream consisting essentially of plasma consisting essentially of ionized carbon and a byproduct of water;
   extracting the ionized carbon within the plasma to form an ion beam; and
   exposing the workpiece to the ion beam to implant the ionized carbon into the workpiece.

2. The process of claim 1, wherein the carbon oxide gas is selected from the group of gases consisting of carbon monoxide, carbon dioxide, carbon suboxide, and combinations thereof.

3. The process of claim 1, wherein ionizing the carbon oxide gas and the methane gas produces greater amounts of the ionized carbon than are created using the carbon oxide gas without the methane gas.

4. The process of claim 1, wherein the methane gas in the mixture is at a molar excess of 70% or less relative to the carbon oxide gas.

5. The process of claim 1, wherein the methane gas in the mixture is at a molar excess of 50% or less relative to the carbon oxide gas.

6. The process of claim 1, wherein the methane gas in the mixture is at a molar excess of 30% or less relative to the carbon oxide gas.

7. The process of claim 1, further comprising evacuating the water from the ion source.

8. A process of implanting carbon ions into a workpiece, comprising
   utilizing an ion implantation apparatus comprising an ion source adapted to ionize a process gas into an ion beam, and a mass analyzer adapted to pass through only selected species of said ion beam;
   supplying a stoichiometric mixture of a carbon oxide gas and a methane gas to the ion source;
   ionizing the carbon oxide gas and methane gas to produce a feedstream consisting essentially of plasma consisting essentially of carbon ions and a byproduct of water vapor;
   using the mass analyzer to remove unwanted species from the ion beam; and
   implanting the carbon ions into the workpiece.

9. The process of claim 8, wherein the carbon oxide gas is a carbon dioxide gas, and the mixture of the carbon dioxide gas and the methane gas are in a 1:1 stoichiometric amount relative to one another.

10. The process of claim 9, wherein the methane gas is at a molar excess relative to the carbon dioxide gas of 70% or less.

11. The process of claim 9, wherein ionizing the mixture produces water vapor, and the process further comprises removing the water vapor from the ion source by vacuum.

12. The process of claim 8, wherein the carbon oxide gas is selected from the group of gases consisting of carbon monoxide, carbon dioxide, carbon suboxide, and combinations thereof.

13. An ion implantation system, comprising:
    an ion source for generating an ion beam;
    a beamline for transporting the ion beam along a beam path; and
    a workpiece support for scanning a workpiece in the beam path of the ion beam for implanting ions into the workpiece;
    said ion implantation system further comprising:
      a first gas source for delivering a carbon ion precursor composition in the form of a carbon oxide gas to said ion source;
      a second gas source for delivering a second gas in the form of a methane gas; and
      a controller coupled to said first and second gas sources for controlling a flow of gas therefrom to meter a 1 to 1 stoichiometric amount of carbon oxide and methane gases, respectively, to the ion source, wherein the ion sources is configured to produce a feedstream consisting essentially of plasma consisting essentially of carbon ions and a byproduct of water vapor.

14. The ion implantation system of claim 13, wherein the carbon oxide gas is selected from the group of gases consisting of carbon monoxide, carbon dioxide, carbon suboxide, and combinations thereof.

* * * * *